United States Patent [19]

Phy et al.

[11] Patent Number: 4,839,717
[45] Date of Patent: Jun. 13, 1989

[54] CERAMIC PACKAGE FOR HIGH FREQUENCY SEMICONDUCTOR DEVICES

[75] Inventors: William S. Phy, Los Altos; James M. Early, Palo Alto, both of Calif.; Kevien J. Negus, Kingston, Canada

[73] Assignee: Fairchild Semiconductor Corporation, Cupertino, Calif.

[21] Appl. No.: 205,040

[22] Filed: Jun. 7, 1988

Related U.S. Application Data

[63] Continuation of Ser. No. 944,499, Dec. 19, 1986, abandoned.

[51] Int. Cl.$^4$ .................... H01L 23/02; H01L 23/16; H01L 39/02
[52] U.S. Cl. ........................................ 357/74; 357/75; 357/80
[58] Field of Search .............................. 357/74, 75, 80

[56] References Cited

U.S. PATENT DOCUMENTS

| | | |
|---|---|---|
| 3,683,241 | 8/1972 | Duncan . |
| 4,288,841 | 9/1981 | Gogal ................................... 357/74 |
| 4,513,355 | 4/1985 | Schroeder et al. ................... 357/74 |
| 4,551,746 | 11/1985 | Gilbert et al. ......................... 357/74 |
| 4,561,006 | 12/1985 | Currie ................................... 357/74 |
| 4,608,592 | 8/1986 | Miyamoto ............................. 357/74 |
| 4,630,172 | 12/1986 | Stenerson et al. ................... 357/74 |

FOREIGN PATENT DOCUMENTS

| | | |
|---|---|---|
| 1305115 | 11/1961 | France . |
| 2263606 | 10/1975 | France . |
| 55-166941 | 12/1980 | Japan . |
| 57-56953 | 4/1982 | Japan . |
| 57-68057 | 4/1982 | Japan . |
| WO84/01470 | 4/1984 | PCT Int'l Appl. . |

OTHER PUBLICATIONS

"The Impact of Inductance On Semiconductor Packaging" by Schaper, L. W., Published: Proc. First Annual Conf. Int'l. Elect. Packaging Soc., Cleveland, Ohio, Nov. 9–10, 1981.

Primary Examiner—William L. Sikes
Assistant Examiner—Gregory Key
Attorney, Agent, or Firm—Townsend and Townsend

[57] ABSTRACT

A ceramic semiconductor package suitable for high frequency operation includes internal and external ground planes formed on opposite faces of a ceramic base member. The internal ground plane is connected to a ground ring formed on the packaged semiconductor device, and both ground planes are interconnected about the periphery of the package. In this way, a uniform and continuous ground is provided to minimize variations in signal transmission line impedance.

13 Claims, 2 Drawing Sheets

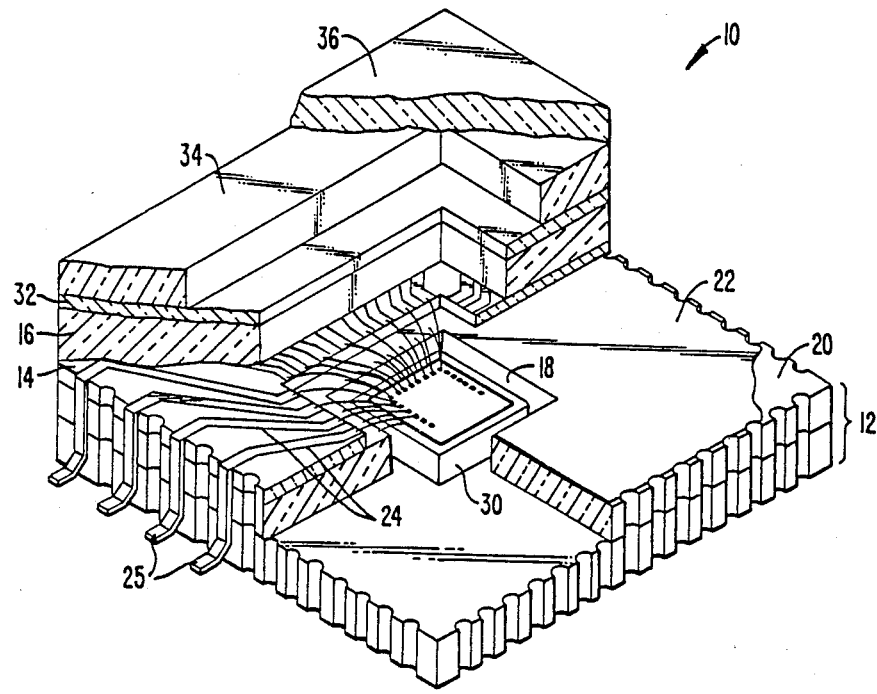
FIG._1.
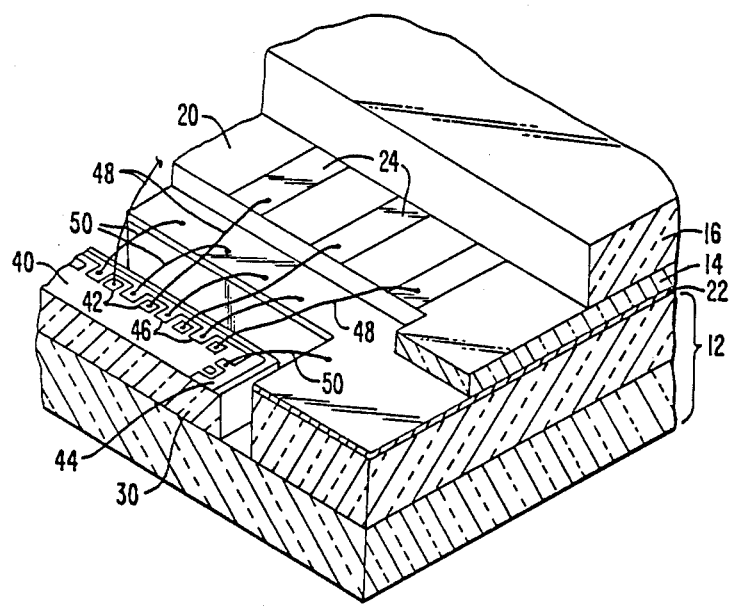
FIG._3.

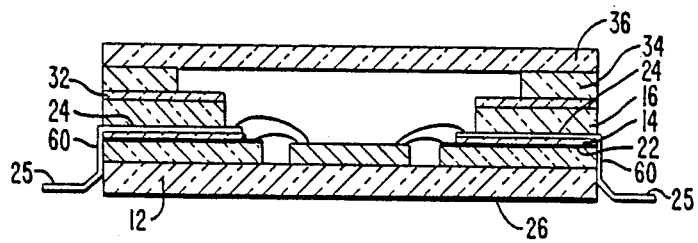
FIG._2.
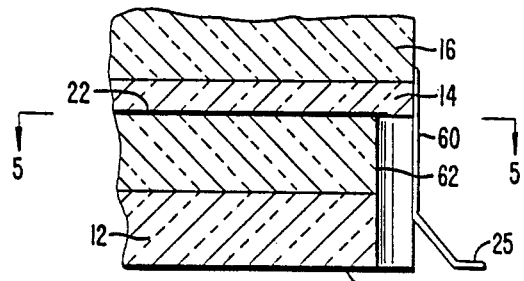
FIG._4.
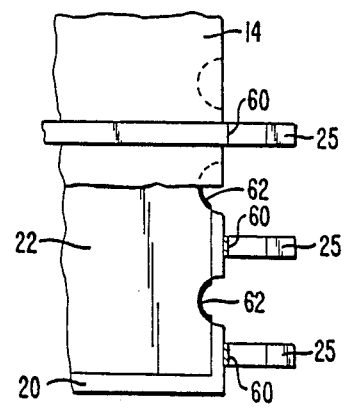
FIG._5.

CERAMIC PACKAGE FOR HIGH FREQUENCY SEMICONDUCTOR DEVICES

This is a continuation of U.S. Ser. No. 944,499, filed Dec. 19, 1986, now abandoned.

BACKGROUND OF THE INVENTION

1. Field of the Invention

The present invention relates generally to the design and fabrication of packages for semiconductor devices. More particularly, it relates to a ceramic semiconductor device package having an improved ground plane, enhanced interlead isolation, and improved lead impedance in order to reduce high frequency signal degradation within the package.

Recent advances in the design and fabrication of silicon bipolar devices provide for gate delays as low as a fraction of a nanosecond, producing operating frequencies in the gigahertz range. The packaging of such high frequency devices, however, promises to be problematic. Although packaging is only a part of the overall chip-to-chip communication system, signal degradation at the package level frequently accounts for a disproportionate share of the degradation in the overall system.

Signal degradation can arise from a variety of factors, including (1) variations in signal line impedance, causing signal reflections which are a major source of noise, (2) resistive losses in the internal package transmission lines, causing signal attenuation, (3) capacitive coupling between adjacent signal transmission lines, causing cross-talk which is another major source of noise, and (4) inductive coupling, particularly in the power and ground connections, causing waveform degradation and cross-talk between the various signals.

It would be desirable to provide semiconductor packages which minimize some or all of the degradative factors listed above. In particular, it would be desirable to provide ceramic semiconductor packages which minimize variations in signal transmission line impedance, minimize resistive losses in the signal transmission lines, reduce capacitive coupling between adjacent signal transmission lines, and reduce inductive coupling in the power and/or ground connections.

2. Description of the Background Art

U.S. Pat. No. 4,551,746 to Gilbert et al. discloses a ceramic semiconductor package having a metallized die attach pad connected to a metallization area by a via and a metallized castellation. Schaper (1981) Proc. First Annual Conference of the International Packaging Society, Cleveland, Ohio, Nov. 9–10, pp. 38–42, describes inductance problems which can arise in packaging high frequency semiconductor devices; see in particular § VIII. Copending U.S. patent application Ser. No. 557,119, now U.S. Pat. No. 4,680,613 assigned to the assignee of the present application, describes a low inductive impedance dual in-line package having a semiconductor device mounted on a ground plane separate from a lead frame. The ground plane is connected to the device ground.

SUMMARY OF THE INVENTION

The present invention provides an improved ceramic semiconductor device package which is particularly suitable for use with high frequency devices, such as silicon emitter coupled logic (ECL) and current mode logic (CML) devices and various gallium arsenide devices having operating frequencies in the gigahertz range. The package includes parallel, spaced-apart ground planes which provide a highly continuous and uniform ground, i.e., the principal alternating current return path. Such a ground reduces inductive coupling and, when properly positioned near the signal transmission lines, reduces impedance variations in such transmission lines and lessens noise resulting from signal reflections.

In the exemplary embodiment, the semiconductor device package is a multiple-layer ceramic package including a base having the ground planes formed on opposite faces thereof. The ground planes are electrically interconnected, usually by a plurality of conductors formed about the periphery of the base. The semiconductor device is preferably mounted in a cavity formed within one of the faces so that it is surrounded by a first of the ground planes, referred to hereinafter as the internal ground plane. A ceramic spacing layer is formed over the internal ground plane, and a plurality of signal transmission lines formed over the spacing layer. The inner ends of the signal transmission lines terminate about the periphery of the cavity, while the outer ends of the lines extend to the outer periphery of the package.

In a particularly preferred embodiment, the semiconductor device includes a plurality of signal bonding pads arranged about the periphery of the device. A ground ring is provided surrounding the bonding pads, and typically includes extensions which project between adjacent bonding pads. The inner ends of the signal transmission lines are connected to the bonding pads, typically by wire or tape bonding, and the ground connections made from the ground ring on the semiconductor device to an exposed portion of the internal ground plane, with the signal connections and ground connections alternating. Such a configuration maximizes ground shielding of the signal lines in order to minimize cross-talk.

The resulting package is completed by one or more additional ceramic or other layers in a conventional manner. The package is mounted on a conventional substrate, typically a printed circuit board, with the second (external) ground plane on the base being attached to a suitable ground connection on the printed circuit board.

BRIEF DESCRIPTION OF THE DRAWINGS

FIG. 1 is an isometric view of a ceramic semiconductor package constructed in accordance with the principles of the present invention, with portions broken away.

FIG. 2 is an elevational view of the package of FIG. 1, shown in cross-section.

FIG. 3 is a detailed isometric view of a portion of the package of FIG. 1, illustrating the alternating signal and ground connections from the semiconductor device to the package transmission lines and ground plane.

FIG. 4 is a detailed, sectional view illustrating a peripheral conductor connecting the spaced-apart ground planes.

FIG. 5 is a detailed view taken along line 5—5 of FIG. 4, with portions broken away.

DESCRIPTION OF THE SPECIFIC EMBODIMENTS

Referring to FIG. 1, a semiconductor device package 10 constructed in accordance with the principles of the present invention includes a ceramic base 12, a ceramic spacing layer 14, and a ceramic isolation layer 16. The ceramic base 12 includes a cavity 18 formed at approximately the center of its upper surface 20. An internal ground plane 22 is formed over the upper surface 20 of ceramic base 12, and extends generally from the periphery of cavity 18 to the outer periphery of the base 12. Preferably, the internal ground plane 22 is spaced inward from the periphery of the base in order to avoid exposure of the ground to the outside, which could lead to shorting. A plurality of signal transmission lines 24 are formed over the ceramic spacing layer 14 and extend generally from cavity 18 to the outer periphery of the package 10, where they then extend downward as illustrated. The outer exposed ends 25 of the transmission lines 24 are used for connecting to a printed circuit board or other substrate, while the inner ends will be connected to contact pads on a semiconductor device 30, as will be described in more detail hereinafter.

Construction of the package 10 is completed with a sealing ceramic layer 32 formed over the isolation ceramic layer 16, and with covering layers 34 and 36 which complete the package enclosure.

The semiconductor package 10 of the present invention, with the exception of the isolation layer 16, is fabricated by conventional ceramic fabrication techniques. Sheets of ceramic material, typically alumina, are prepared by casting a dispersion or slurry of ceramic powder in a suitable solvent into thin sheets having a desired thickness. After drying, the transmission lines 24 are screened over the top of the spacing layer, typically using a tungsten ink, and the sheets are cut to size. The holes defining the cavity 18 are then cut. Conveniently, the base 12 will be about 15 to 25 mils thick and may be formed from separate layers 12a and 12b. The cavity 18 is formed by punching a hole through the upper layer 12b only. After forming the ground plane 22 over the top of base layer 12b (as described hereinafter), the ceramic sheets may be press-laminated together and the entire structure fired at high temperature, typically above 1500° C., to form a monolithic sintered structure.

After the laminated structure is sintered, the exposed ends of the transmission lines 24 and exposed surface of the ground plane 22 must be readied for lead attachment. Typically, the metal surfaces are plated with gold to improve the bonding characteristics and protect against oxidation.

The isolation layer 16 is preferably a low dielectric constant ($\epsilon_1/\epsilon_0$) material, typically having a dielectric constant below about 7, more typically having a dielectric constant below about 5. This compares with conventional alumina ceramics used in ceramic packaging technology which have a relatively high dielectric constant of about 9.5. Suitable ceramic materials include beryllium oxide and specially formed low dielectric constant aluminas.

The thickness of the dielectric material is not critical, being selected to provide the desired isolation, usually being in the range from about 5 to 30 mils, more usually being about 25 mils. The sealing ceramic layer 32 is typically about 5 mils thick, while covering layers 34 and 36 will be about 20 mils thick.

Referring now to FIG. 2, the transmission lines 24 extend outward from proximate cavity 18 to the outer periphery of the package 10. At the outer edge of package 10, the transmission lines 24 are joined to vertical contact members 60. The contact members 60 extend downward along the side of package 10 and project outward from the package along a plane even with the bottom of the package to form contact members 25. The contact members 25 may be connected to a conventional substrate, such as a printed circuit board, as described previously. An external ground plane 26 is formed on the bottom of base 12, and both it and the internal ground plane 22 are formed by conventional methods, such as tungsten metallization.

Referring now in particular to FIG. 3, the connection of a semiconductor 30 to the transmission lines 24 and the internal ground plane 22 will be described. Semiconductor device 30 includes an active surface 40 having a plurality of signal bonding pads 42 formed about its periphery. A ground ring 44 surrounds the bonding pads 42 and includes extensions 46 which project between adjacent bonding pads 42. A plurality of signal bonding members 48 are formed between the bonding pads 42 and the inner ends of transmission lines 24. The single bonding members 48 may be formed by any conventional technique, typically by wire bonding or tape bonding, preferably tape bonding which provides for reduced resistance and inductance, and thus, lower signal losses. Additional ground bonding members 50 are formed from the extensions 46 of ground ring 44 to an exposed portion of the internal ground plane. The exposed portion results from the setback of spacing layer 14, as best observed in FIGS. 1 and 2. As a result of the bonding as just described, the signal bonding members 48 are spaced alternately with the ground bonding members 50 to maximize shielding and limit cross-talk between the leads.

As best illustrated in FIGS. 4 and 5, the internal ground plane 22 and external ground plane 26 are electrically interconnected by a plurality of peripheral conductors 62. The conductors 62 are formed in vertical channels (castellations) 64 equally spaced about the outer periphery of base 12. The conductors 62 comprise a metal layer deposited within the channel 64 and are connected at one end to internal ground plane 22 and at the other end to external ground plane 26. Usually, the metal will be the same as the ground planes 22 and 26, and at least as many conductors 62 will be provided as there are transmission lines 24 and outer contact members 60. In this way, the outer contact member 60 may be located between adjacent peripheral conductors 62 which, as they are maintained at the reference ground, will act to shield the contact members from each other. Moreover, the multiplicity of peripheral connectors 62 helps assure the uniformity of ground at all points on the ground planes 22 and 26.

Although the foregoing invention has been described in some detail by way of illustration and example for purposes of clarity of understanding, it will be obvious that certain changes and modifications may be practiced within the scope of the appended claims.

What is claimed is:

1. A ceramic semiconductor package comprising:
    a ceramic base having parallel faces and a peripheral edge between said faces, wherein a first of said faces includes a site for attaching a semiconductor device;
    an internal ground plane formed on said first of said faces and extending substantially from the attachment site to the peripheral edge;
    an external ground plane formed on a second of said faces and covering substantially the entire area thereof;

means for electrically connecting the internal ground plane and the external ground plane, said means including a plurality of conductors evenly spaced about the periphery of the base and extending between said first and second faces;

a ceramic spacing layer over the internal ground plane on the first face of the ceramic base;

a plurality of signal transmission lines formed over the ceramic spacing layer;

a ceramic isolation layer formed over the ceramic spacing layer and filling spaces between adjacent conductors; and a cover layer.

2. A ceramic semiconductor package as in claim 1, wherein the attachment site is a cavity formed in the ceramic base.

3. A ceramic semiconductor package as in claim 2, wherein said spaced conductors are recessed in channels extending between the parallel faces.

4. An improved semiconductor package of the type including a ceramic base having a pair of parallel surfaces with a cavity formed in a first of those surfaces, a semiconductor device mounted in the cavity in the base and having peripheral bonding pads and a plurality of ceramic layers over the base enclosing the semiconductor device, and a plurality of conductors lying in a plane between adjacent ceramic layers and extending from proximate the semiconductor device to the periphery of the package, the improvement comprising:

an internal ground plane formed about the cavity on said first surface of the base parallel to the conductor plane;

an external ground plane formed on a second surface of the base parallel to the conductor plane;

means for electrically connecting the internal and external ground planes to each other; and means at or near the periphery of the cavity for electrically connecting the internal ground plane to a ground on the semiconductor device.

5. An improved semiconductor package as in claim 4, wherein the semiconductor device includes a ground ring formed about the peripheral bonding pads, and wherein the ground ring is electrically connected to the internal ground plane.

6. An improved semiconductor package as in claim 5, wherein the ground ring on the semiconductor device is connected to the internal ground plane of the package by a plurality of ground bonding members spaced-apart about the periphery of the semiconductor device.

7. An improved semiconductor package as in claim 6, wherein the peripheral bonding pads on the semiconductor device are connected to the conductors between adjacent ceramic layers by a plurality of signal bonding members, and wherein said signal bonding members and the ground bonding members are alternated to improve uniformity in the ground connection and decrease coupling between adjacent signal bonding members.

8. An improved semiconductor package as in claim 7, wherein the signal and ground bonding members are wire bonds.

9. An improved semiconductor package as in claim 7, wherein the signal and ground bonding members are tape bonds.

10. An improved semiconductor package as in claim 4, wherein the means for electrically connecting the internal and external ground planes includes a plurality of conductors spaced-apart about the periphery of the base and extending between the first and second faces.

11. An improved semiconductor package as in claim 10, wherein the periphery of the ceramic base includes channels extending between said first and second faces and wherein said spaced-apart conductors are recessed in said channels.

12. An improved semiconductor package as in claim 11, wherein said conductors include terminal connectors at the periphery of the base.

13. An improved semiconductor package as in claim 12, wherein the terminal connectors are located between adjacent spaced-apart conductors.

* * * * *